(12) United States Patent
Yazawa (10) Patent No.: US 7,099,153 B2
(45) Date of Patent: Aug. 29, 2006

(54) HEAT DISSIPATING STRUCTURE FOR AN ELECTRONIC DEVICE

(75) Inventor: Kazuaki Yazawa, Chiba (JP)

(73) Assignee: Sony Computer Entertainment Inc., Tokyo (JP)

( * ) Notice: Subject to any disclaimer, the term of this patent is extended or adjusted under 35 U.S.C. 154(b) by 265 days.

(21) Appl. No.: 10/681,073

(22) Filed: Oct. 8, 2003

(65) Prior Publication Data

US 2004/0114330 A1    Jun. 17, 2004

(30) Foreign Application Priority Data

Oct. 10, 2002    (JP) ............................. 2002-296897

(51) Int. Cl.
*H05K 7/20* (2006.01)

(52) U.S. Cl. .................... 361/692; 361/688; 361/690; 361/704; 361/714; 361/721; 165/80.3; 165/185

(58) Field of Classification Search ................ 361/687, 361/689, 690–695, 702–704, 712–714, 717–724; 454/43, 184; 165/80.3, 128, 129, 185; 257/713–726; 219/209, 385, 400; 312/236; 124/16.1, 124/16.3; 174/15.1, 16.3, 252
See application file for complete search history.

(56) References Cited

U.S. PATENT DOCUMENTS

| | | | | | |
|---|---|---|---|---|---|
| 2,965,819 | A | * | 12/1960 | Rosenbaum | ................ 257/722 |
| 3,236,296 | A | * | 2/1966 | Dubin | ........................ 165/80.3 |
| 3,961,666 | A | * | 6/1976 | Suzuki et al. | ............... 165/129 |
| 4,042,903 | A | * | 8/1977 | Finegan, Jr. | ................ 338/159 |
| 4,095,998 | A | * | 6/1978 | Hanson | ....................... 136/208 |
| 4,633,371 | A | * | 12/1986 | Nagy et al. | .................. 361/699 |
| 4,840,225 | A | * | 6/1989 | Foley et al. | ........... 165/104.33 |
| 5,089,935 | A | * | 2/1992 | Ito | ............................... 361/692 |
| 5,218,516 | A | * | 6/1993 | Collins et al. | .............. 361/721 |
| 6,493,224 | B1 | * | 12/2002 | Mottahed | .................... 361/692 |
| 2002/0122299 | A1 | * | 9/2002 | Kelly et al. | ................. 361/704 |

FOREIGN PATENT DOCUMENTS

| | | |
|---|---|---|
| JP | 11-233977 | 8/1999 |
| JP | 2002-111263 | 4/2000 |
| JP | 2000-352399 | 12/2000 |
| JP | 02001291982 A * | 10/2001 |

OTHER PUBLICATIONS

Patent Abstracts of Japan 09-212258 dated Aug. 15, 1997.
Allan D. Kraus et al., "Design and Analysis of Heat Sinks", 1995 A Wiley-Interscience Publication, pp. 286-291.

(Continued)

*Primary Examiner*—Michael Datskovskiy
(74) *Attorney, Agent, or Firm*—Frommer Lawrence & Haug LLP; William S. Frommer; Thomas F. Presson (57) ABSTRACT

A heat dissipating structure for an electronic device includes a heat source and a heat dissipating member. The heat dissipating member has an inner wall, an outer wall, and a plurality of partition walls. The inner wall receives heat transfer from the heat source. The outer wall opposes the inner wall at a distance. The partition walls connect the inner wall and the outer wall, and together with the inner wall and outer wall define a plurality of through-holes which are approximately the same shape and are aligned at roughly regular intervals along the inner wall or the outer wall. The through-holes are arranged along the vertical direction that allows most effective utilization of gravitational influence, and are open to the outside at the upper and lower ends thereof.

12 Claims, 4 Drawing Sheets

OTHER PUBLICATIONS

Akash Jain et al., "Buoyancy-Driven Flow in Channels With In-Line Pin Fins" Proceedings of ASME NHTC'01, 35th National Heat Transfer Conference Anaheim, California, Jun. 10-12, 2001, pp. 1-8.

William K. Coxe III et al., "Experimental Modeling of the Passive Cooling Limit of Notebook Computers", 2002 Inter Society Conference on Thermal Phenomena, pp. 15-21.

* cited by examiner

HEAT DISSIPATING STRUCTURE FOR AN ELECTRONIC DEVICE

BACKGROUND OF THE INVENTION

1. Field of the Invention

The present invention relates to a heat dissipating structure for an electronic device.

2. Description of the Related Art

As a conventional heat dissipating structure for an electronic device, there is one that utilizes natural convection due to the so-called chimney effect. With this structure, the upper and lower ends of a chimney passageway are respectively opened to the outside so as to dissipate heat by utilizing the air that naturally flows upwards through the chimney passageway (for example, see Japanese Patent Application Laid-open No. 9-212258).

Nevertheless, the conventional structure is not necessarily a suitable structure for the chimney effect, whereby sufficient heat dissipation results could not be obtained.

SUMMARY OF THE INVENTION

The present invention aims to provide a heat dissipating structure for an electronic device that can achieve a sufficient heat dissipating effect due to natural convection with consideration of such above circumstances.

In order to achieve the objective described above, the heat dissipating structure for an electronic device according to the present invention includes a heat source (or heat sources) and a heat dissipating member. The heat dissipating member has an inner wall, an outer wall, and a plurality of partition walls. The inner wall directly or indirectly receives heat from the heat source(s). The outer wall opposes the inner wall at a distance. The partition walls connect the inner wall and the outer wall, and together with the inner wall and outer wall, define a plurality of through-holes which are arranged along the inner wall or the outer wall. The through-holes vertically extend within an allowable tilt range in which gravitational influence is utilizable, and are open to the outside at the upper and lower ends thereof.

It is preferable that a tilt of the through-holes against a plumb line is under 60°, more preferably under 30° toward vertical.

The through-holes may be lined up approximately in line or in a circle.

With the above structure, the heat from the heat source is directly or indirectly propagated to the inner wall of the heat dissipating member, and then propagated to the outer wall of the heat dissipating member via the plurality of partition walls, heating the air within the through-holes that are sectioned off by the inner wall, partition walls, and outer wall. The through-holes vertically extend within the tilt range that allows effective utilization of gravitational influence, and are open to the outside at the upper and lower ends thereof. Consequently, when the temperature of the air within the through-holes rises, natural convection upwardly occurs, namely heat dissipation occurs due to the chimney effect.

Since the partition walls are arranged in plural along the inner wall or outer wall, fluctuation of heat transfer from the inner wall to the outer wall occurring along the length of the inner wall or the outer wall is controlled. As a result, the temperature difference between the inner wall, partition walls and the outer wall may be kept small. In other words, a favorable chimney effect can be achieved by making the ambient temperature of the through-holes that function as chimney passageways even, and the air within the through-holes flow smoothly. Accordingly, effectively achieving a heat dissipating effect due to natural convection is possible.

Furthermore, since the heat dissipating member has an inner wall and an outer wall that are connected via a plurality of partition walls, it can function as an enforcing member with great mechanical strength.

The plurality of through-holes may have approximately the same shape, and may further be lined up along the inner wall or the outer wall at approximately regular intervals.

With the above structure, since the partition walls are lined up in plural along the inner wall or outer wall at regular intervals, equal heat transfer from the inner wall to the outer wall occurs along the length of the inner wall and the outer wall. As a result, the temperature difference between the inner wall, partition walls and the outer wall may be kept small. In other words, an extremely favorable chimney effect can be achieved by making the ambient temperature of the through-holes that function as chimney passageways evener, and the air within the through-holes flow smoothly. Furthermore, since the each of the through-holes is roughly the same shape, the equivalent chimney effect may be achieved therewith. Accordingly, more effectively achieving a heat dissipating effect due to natural convection is possible.

The cross-sectional shapes of the through-holes that are orthogonal to the vertical direction may be set to be roughly the same at arbitrary positions in the vertical direction.

With the above structure, since a smoother upward flow of air occurs, the heat dissipation due to natural convection is taken effect.

The optimum distance between the opposing inner sides of two adjacent partition walls may be set in accordance with the linear function of the vertical length of the through-holes, and the distance between the opposing inner sides may be set based upon the optimum distance.

For example, assuming the optimum distance between the opposing inner sides of two adjacent partition walls is $w_{opt}$, the vertical length of the through-holes is L, and the distance between the opposing inner sides of two adjacent partition walls is w, $w_{opt}$ may be set according to the following equation $$w_{opt} = 0.01L + 0.005$$

and w may be set within the range of $$0.95\, w_{opt} \leq w \leq 1.2\, w_{opt}$$

With the above structure, since the distance between the inner sides of two adjacent partition walls is appropriately set in accordance with the vertical length of the through-holes, the heat dissipating effect due to natural convection is further improved.

A heat diffusing member that touches the heat source and the outer side of the inner wall may be provided between the heat source and the inner wall of the heat dissipating member. Furthermore, the inner wall of the heat dissipating member may be structured so as to have a heat diffusing function, and be positioned to touch the heat source.

With the above structure, since the temperature difference between the portions of the inner wall that are close to and the portions that are far apart from the heat source is further reduced due to the heat dissipating function of the heat diffusing member or the inner wall, and evener ambient temperature of the through-holes that function as chimney passageways is made, the heat dissipating effect is further improved.

It is preferable that the cross-section that is vertically orthogonal to the through-holes is approximately a square shape, and is more preferable if lengths of the four sides of the through-hole cross-section are set almost equal. In other words, it is preferable that the cross-sectional shape of the through-holes is close to a square.

With the above structure, since the cross-section that is orthogonal to the vertical direction of the through-holes is approximately a square shape, and the widths of the partition walls are formed almost equal, evener ambient temperature of the through-holes that function as chimney passageways is made by performing more favorable heat transfer from the inner wall to the outer wall, further improving the heat dissipating effect. Furthermore, among quadrangles, the ones closer to a square allow smoother upward flow of air, further improving the heat dissipating effect due to natural convection.

The heat source and heat dissipating member may be housed in a case so as to make the outer side of the outer wall of the heat dissipating member have surface contact with the inner side of the case, or an enclosed space may be sectioned off by the inner wall of the heat dissipating member so as to house the heat source within that enclosed space.

With the above structure, since heat dissipation from the outer wall of the heat dissipating member occurs either directly or via the case, the heat dissipating effect is improved overall.

The outer side of the outer wall of the heat dissipating member may have a cooling fin.

With the above structure, the heat release from the outer wall of the heat dissipating member increases, further improving the heat dissipating effect overall.

Artisan will fully understand the above and further objects and features of the present invention by reading preferred embodiments of the invention described herein in connection with the accompanying drawings, including features recited in the appended claims, as well as explicit and implicit effects and advantages of the invention, including those to be apparent through implementation of the invention.

DETAILED DESCRIPTION OF THE PREFERRED EMBODIMENTS

A preferred embodiment of the present invention is described below with reference to the accompanying drawings. It is noted that like parts or elements are designated by like reference characters in the drawings, without redundant description of the parts or elements.

Figure 1:
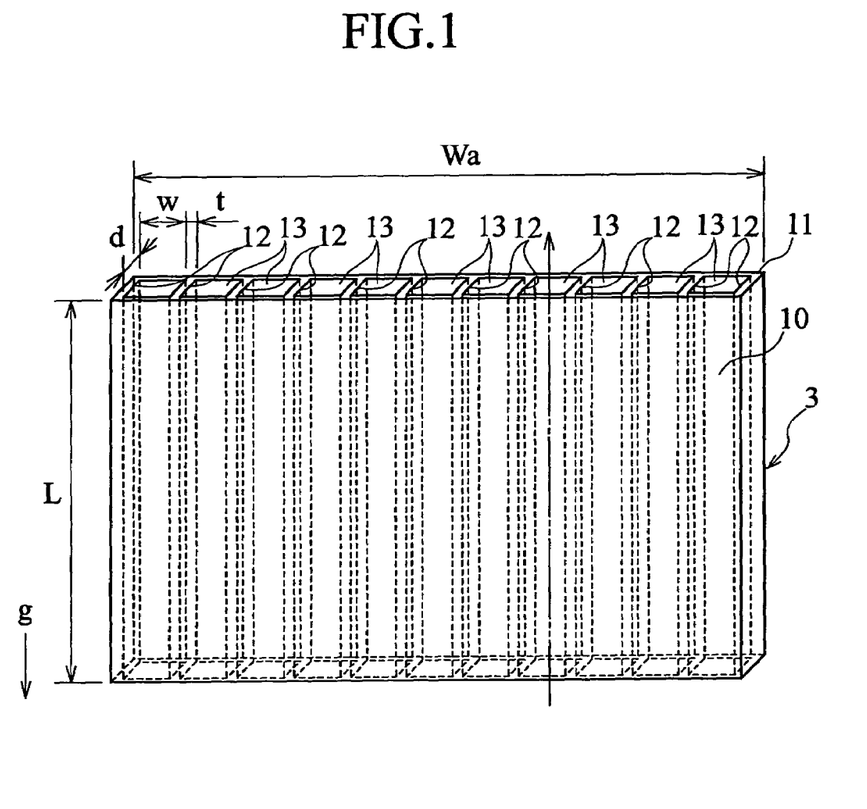
FIG. 1 is a perspective view of the main parts of a heat dissipating structure for an electronic device according to a first embodiment of the present invention.
Figure 2:
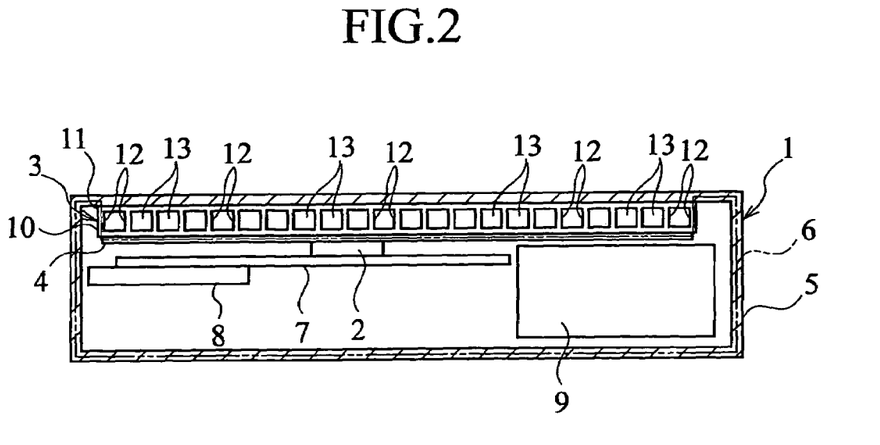
FIG. 2 is a general cross-sectional view of the heat dissipating structure of FIG. 1.

FIG. 1 is a perspective view of the main parts of a heat dissipating structure for an electronic device according to this embodiment, and FIG. 2 is a general cross-sectional view of the heat dissipating structure of FIG. 1.

As illustrated in FIG. 2, the heat dissipating structure for an electronic device according to this embodiment includes a case 1, a heat source 2, a heat dissipating member 3, and a spreader 4 which acts as a heat diffusing member.

The case 1 includes a rectangular tube-shaped peripheral wall 5, and a cover 6 which is fixed at the top and bottom of the peripheral wall 5, where the electronic device is utilized in a state where the peripheral wall 5 is installed in a roughly vertical direction. The peripheral wall 5 and cover 6 are both made of a synthetic resin (for example, ABS resin). In addition to the heat source 2, heat dissipating member 3, and spreader 4, various electronic parts 7, 8, and 9 are housed and fixed within the case 1. For example, in the case where the electronic device is a personal computer, a CPU, a hard disc drive, a main memory, an AC power adapter or the like is the heat source 2.

The heat dissipating member 3 has an inner wall 10, an outer wall 11, and a plurality of partition walls 12. The inner wall 10 and outer wall 11 both have an approximately flat plate shape, opposing each other roughly parallel with space therebetween. The outer side of the outer wall 11 is fixed making surface contact with the inner side of the peripheral wall 5 of the case 1. The partition walls 12 extend in a roughly vertical direction and are arranged in plurality roughly parallel at regular intervals along the inner wall 10 and outer wall 11 so as to connect the inner wall 10 and outer wall 11. Accordingly, the inner wall 10, outer wall 11, and partition walls 12 section off and form a plurality through-holes 13 which are roughly the same shape and are aligned approximately linear at roughly regular intervals along the direction that is approximately orthogonal to the vertical direction.

The through-holes 13 are set so as to extend approximately linear in the vertical direction within the tilt range in which gravitational influence is utilizable during electronic device usage. More specifically, it is preferable that the tilt of the through-holes 13 against a plumb line is under 60°, more preferably under 30°, however, in this embodiment, it is fixed in a roughly vertical direction (a direction approximately parallel to gravitational acceleration g) that is most preferable. The cover 6 closes the portion of the region surrounded by the upper end and the lower end of the peripheral wall 5 of the case 1 excluding the through-holes 13, wherein the upper and lower ends of the through-holes 13 are open to the outside of the case 1.

The spreader 4 is formed in a board shape and is positioned between the heat source 2 and the inner wall 10 of the heat dissipating member 3. The front and back sides of the spreader 4 touch the heat source 2 and almost the entire outer side of the inner wall 10, respectively, wherein the inner wall 10 indirectly receives heat transfer from the heat source 2 via the spreader 4. The spreader 4 is made of a highly thermally conductive metal (for example, magnesium, aluminum, copper, silver, gold or the like), and diffuses and transfers to the inner wall 10 the heat received from the heat source 2 through contact therewith. A spreader with a built-in thin two-layer heat transport mechanism (a vapor chamber, closed loop heat pipe or the like) may also be provided as the heat diffusing member. Furthermore, without additionally providing a heat diffusing member, the inner wall 10 may function to diffuse heat by forming it with a metal of high thermal conductivity, whereby in this case, the heat dissipating member is positioned to touch the heat source.

The cross-section of the through-holes 13 that is orthogonal to the vertical direction (plumb line direction) is set as a quadrilateral that is almost a square (a quadrilateral with little difference in horizontal and vertical lengths). Furthermore, the cross-sectional shapes of the through-holes 13 which are orthogonal to the vertical direction (plumb line direction) are set to be roughly the same at arbitrary positions in the vertical direction (plumb line direction).

As illustrated in FIG. 1, thickness t of the partition walls 12 is set smaller than distance w between the inner sides of two neighboring partition walls 12 (hereafter, referred to as the interval of partition walls 12). The interval w of these partition walls 12 is set on the basis of the optimum distance $w_{opt}$ (optimum interval) thereof, where the optimum distance $w_{opt}$ is set according to a linear function of the vertical length L of the through-holes 13. More specifically, in the case where the optimum interval of the partition walls 13 is $w_{opt}$(m), the length of the through-holes 13 is L (m), and the interval of the partition walls 12 is w (m), the optimum interval $w_{opt}$ is set according to the following equation (1).

$$w_{opt} = 0.01L + 0.005 \quad (1)$$

Distance w is then set within the range of the following equation (2).

$$0.95 w_{opt} \leq w \leq 1.2 w_{opt} \quad (2)$$

Next, basis for the above equation (1) and equation (2) are explained.

In the case where the heat dissipating structure illustrated in FIG. 1 is used as a model, the height of the heat dissipating member 3 (vertical length L of the through-holes 13) is assumed within the range of 0.02 m to 1.0 m, and the rise in temperature at the inner wall 10 of the heat dissipating member 11 in accordance with the atmospheric temperature surrounding the case 1 is limited to the range of 20° C. to 50° C., equation (1) and equation (2) are those derived from the results obtained through the following equation.

Heat release Q is calculated according to the following equation (3) under the assumption that temperatures at the peripheral sides (inner sides of the inner wall 10, outer wall 11, and partition walls 12) of the through-holes 13 are even.

$$Q = h\, S(Tw - Ta) \quad (3)$$

Tw is the temperature at the peripheral sides of the through-holes 13, and Ta is the surrounding atmospheric temperature, where S and h are values calculated according to the following equations (4) and (5).

$$S = 2(w + d)L \quad (4)$$

$$h = Nu \frac{k_f}{z} \quad (5)$$

As indicated above, w and L are the interval (m) of the partition walls 12 and the vertical length (m) of the through-holes 13, respectively, d is the distance (m) between the inner wall 10 and the inner side of the outer wall 11 opposing thereto (hereafter, referred to as width of the through-holes 13), and kf is the thermal conductivity (W/mK) of air. Nu is a Nusselt Number (dimensionless thermal conductivity) and is given by the following equation (6).

$$Nu = \left[\frac{576}{(El)^2} + \frac{2.87}{(El)^{1/2}}\right]^{-1/2} \quad (6)$$

This El is an Elenbaas Number that represents the intensity of the occurring natural convection, and is defined by the following equation (7) in this embodiment.

$$El = \frac{g\rho^2 \beta C_p (T_w - T_a) z^4}{\mu k_f L} \quad (7)$$

The first term of equation (6) is called a fully developed limit, which signifies a phenomenon where the flow of air unifies at the place where two walls are close together, and the second term is called an isolated plate limit, which signifies the flow of air between separated walls. Either case indicates that heat transfer increases as the gap grows large. As the equation indicates, they are dependent on the physical properties of air, and are weak functions of temperature. In equation (7), g is gravitational acceleration, ρ is density, β is the volumetric expansion coefficient (=inverse of the absolute temperature), Cp is fixed volume specific heat, and μ is the viscosity coefficient of air.

The z in equations (5) and (7) is an approximate function determining the influence that interval w and width d of the partition walls 12 have on the Elenbaas Number, and is defined in this embodiment by the following equation (8).

$$z = \left[\frac{1}{w^2} + \frac{1}{d^2}\right]^{-1/2} \quad (8)$$

Figure 3:
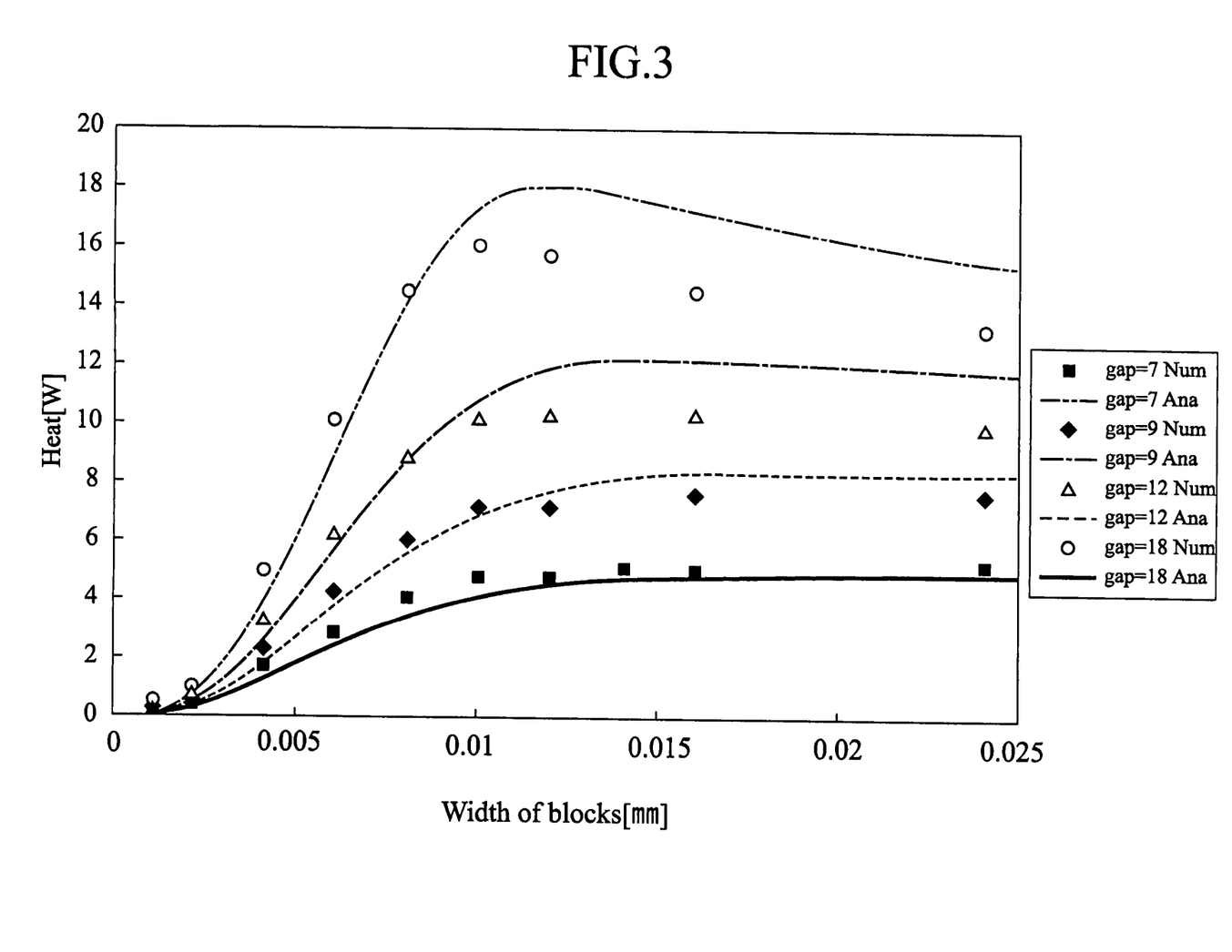
FIG. 3 is a diagram illustrating by comparison under specified conditions the relationship between the theoretical heat release and interval w according to this embodiment, and the relationship between the heat release and interval w calculated in accordance with the finite volume theory.

FIG. 3 is a diagram illustrating, on the comparison basis under specified conditions, the relationship between the heat release and interval w calculated in accordance with the above theoretical equations (3) through (8), and the relationship between the heat release and interval w calculated in accordance with the finite volume theory. Provided the set conditions are Tw=60° C., Ta=40° C., L=0.26 m, and width Wa of the entire heat dissipating member 3 is 0.2 m, the four cases of d set as 7 mm (0.007 m), 9 mm (0.009 m), 12 mm (0.012 m), and 18 mm (0.018 m) are calculated. Furthermore, the results calculated in accordance with the above equations (3) through (8) are represented by the lines indicated in the drawing with the term "Ana", and the results calculated in accordance with the finite volume theory are represented by the plotted points indicated in the drawing with the term "Num". It is apparent from FIG. 3 that the results calculated in accordance with equations (3) through (8) and the results calculated in accordance with the finite volume theory are analogous. It can be said that this result verifies that the heat release (theoretical heat release) calculated in accordance with the theoretical equations (3) through (8) is analogous to the actual heat release.

The linear function for length L determining the optimum interval $w_{opt}$ of the through-holes 13 is obtained by the following method.

To begin with, the relationship between the theoretical heat release and interval w under various conditions is obtained, the peak value w under those conditions is obtained, and the relationship between w which is this peak, and length L is plotted in one graph for all conditions so as to obtain an approximate straight line of those plotted points. The function obtained as that result is the above equation (1). Furthermore, the range of equation (2) represents what is understood as the effective portion within the fluctuation range relative to the approximate straight line.

Figure 4:
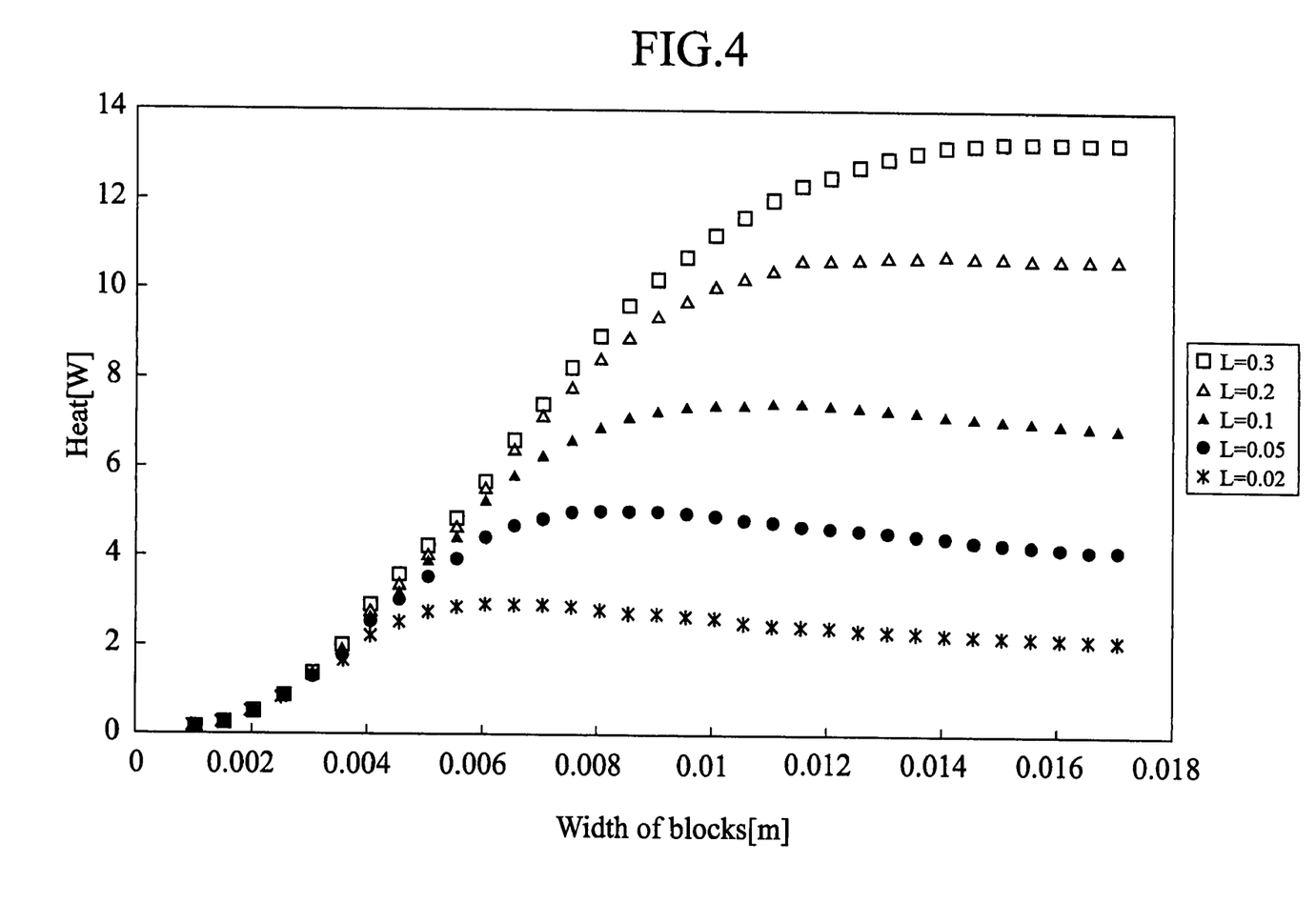
FIG. 4 is a diagram illustrating an exemplary relationship between the theoretical heat release and interval w obtained under specified conditions.

FIG. 4 is a diagram illustrating an exemplary relationship between the theoretical heat release and interval w obtained under specified conditions. Provided the set conditions are Tw=60° C., Ta=40° C., width Wa of the entire heat dissipating member 3 is 0.2 m, and d=0.012 m, the five cases of L set as 0.3 m, 0.2 m, 0.1 m, 0.05 m, and 0.02 m are calculated. It is apparent from FIG. 4 that heat release increases as interval w increases, where the longer length L, the greater the increasing amount. Furthermore, it is apparent that in the proximity of w=d (=0.012), the heat release is large regardless of length L.

According to the heat dissipating structure of this embodiment that is structured as such, the heat from the heat source 2 is propagated to the inner wall 10 of the heat dissipating member 3 via the heat diffusing member 4, and then propagated to the outer wall 11 via the plurality of partition walls 12, heating the air within the through-holes 13 that are sectioned off by the inner wall 10, partition walls 12, and outer wall 11. The through-holes 13 extend roughly parallel to the plumb line direction that allows utmost effective utilization of gravitational influence, as well as are open to the outside at the upper and lower ends of the case 1. Consequently, when the temperature of the air within the through-holes 13 rises, natural convection upwardly occurs, namely heat dissipation occurs due to the chimney effect.

Since a plurality of partition walls 12 are lined up at regular intervals along the inner wall 10 and outer wall 11, heat transfer from the inner wall 10 to the outer wall 11 occurs equally along the length of the inner wall 10 and the outer wall 11. As a result, the temperature difference between the inner wall 10, partition walls 12 and outer wall 11 may be kept small. The temperature difference between the portions of the inner wall 10 that are close to and the portions that are far apart from the heat source 2 is further reduced particularly due to the heat dissipating function of the spreader 4. Accordingly, a favorable chimney effect is achieved by making the ambient temperature of the through-holes 13 that function as chimney passageways even, and the air within the through-holes 13 flow smoothly. Furthermore, since the through-holes 13 are roughly the same shape, the equivalent chimney effect may be achieved therewith. Accordingly, effectively achieving a heat dissipating effect due to natural convection is possible.

Since the cross-sectional shape of the through-holes 13 that is orthogonal to the vertical direction is approximately the same at arbitrary positions in the vertical direction, the upward flow of air occurs more smoothly, improving the heat dissipating effect due to natural convection.

Since the cross-section of the through-holes 13 that is orthogonal to the vertical direction is an approximate square shape, and the widths of the partition walls 12 are formed almost equal, it is not easy for a bottleneck portion to be generated while heat is transferred from the inner wall 10 to the outer wall 11, thus heat transfer is more favorably performed. Accordingly, evener ambient temperature of the through-holes that function as chimney passageways is made, further improving the heat dissipating effect. Moreover, among quadrangles, the ones closer to a square allow smoother upward flow of air, further improving the heat dissipating effect due to natural convection.

Since interval w of the partition walls 12 is set in accordance with equation (1) which allows calculation of the optimum value for heat dissipation performance, the heat dissipating effect due to natural convection is further improved.

There is surface contact with the outer wall 11 of the heat dissipating member 3 and the inner side of the peripheral wall 5 of the case 1, and heat is dissipated from the outer wall 11 via the case 1, improving the heat dissipating effect overall.

As in the above, since a sufficient heat dissipating effect due to natural convection may be achieved with the heat dissipating structure of this embodiment, heat dissipation for electronic devices is possible without using forced cooling with a fan or the like. Accordingly, rise in costs and generation of noise caused by providing a fan or the like may also be controlled. Furthermore, long term-reliability is secured since the heat dissipating effect is not reduced due to failure of a fan or the like. Furthermore, since there is no need to provide a fan or the like, improving space efficiency within the case 1 as well as achieving weight reduction is possible, thereby contributing to the reduction in size and weight of electronic devices. Moreover, by applying the heat dissipating structure of this embodiment to forced cooling provided with a fan or the like, reduction of the load on the fan or the like, reduction of running costs, and reduction of noise becomes possible.

Furthermore, since the heat dissipating member 3 has a structure where the inner wall 10 and the outer wall 11 are connected via the plurality of partition walls 12, it can function as an enforcing member with great mechanical strength. Accordingly, improving reliability in view of strength of the entire device provided with a heat dissipating member, as well as controlling rise in costs caused from additionally providing an enforcing member is possible.

Figure 5:
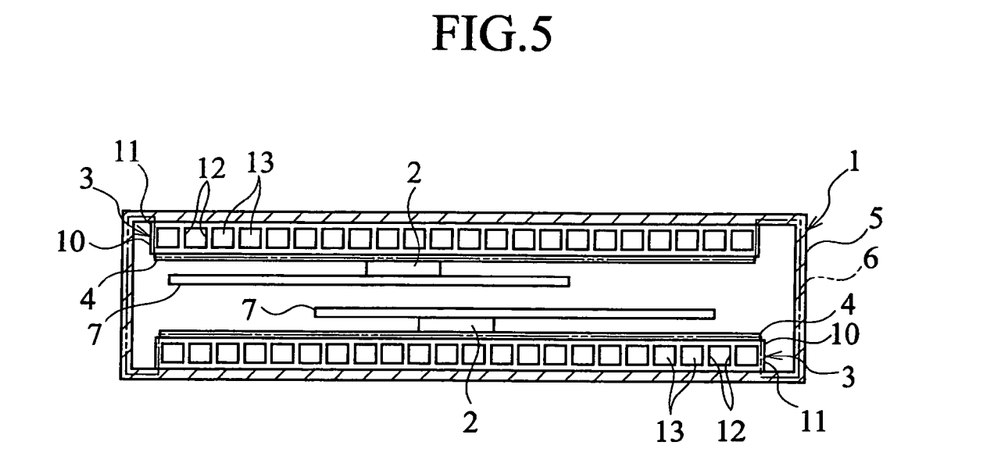
FIG. 5 is a cross-sectional view of a first modified example.

FIG. 5 is a cross-section illustrating a first modified example of the above embodiment, where the same symbols are given to the same structural portions as with the above embodiment, and description thereof will be omitted.

This modified example is one that provides within the case 1 two sets of the heat source 2, the heat dissipating member 3, and the spreader 4. The outer walls 11 of the two heat dissipating member 3 are respectively fixed making surface contact with the opposing inner side of the peripheral wall 5 of the case 1.

According to such structure, since a plurality of inner sides of the peripheral wall 5 of the case 1 are being effectively utilized, even if a plurality of the heat source 2 are provided, heat dissipation due to natural convection may be effectively achieved as in the case with the above embodiment.

Figure 6:
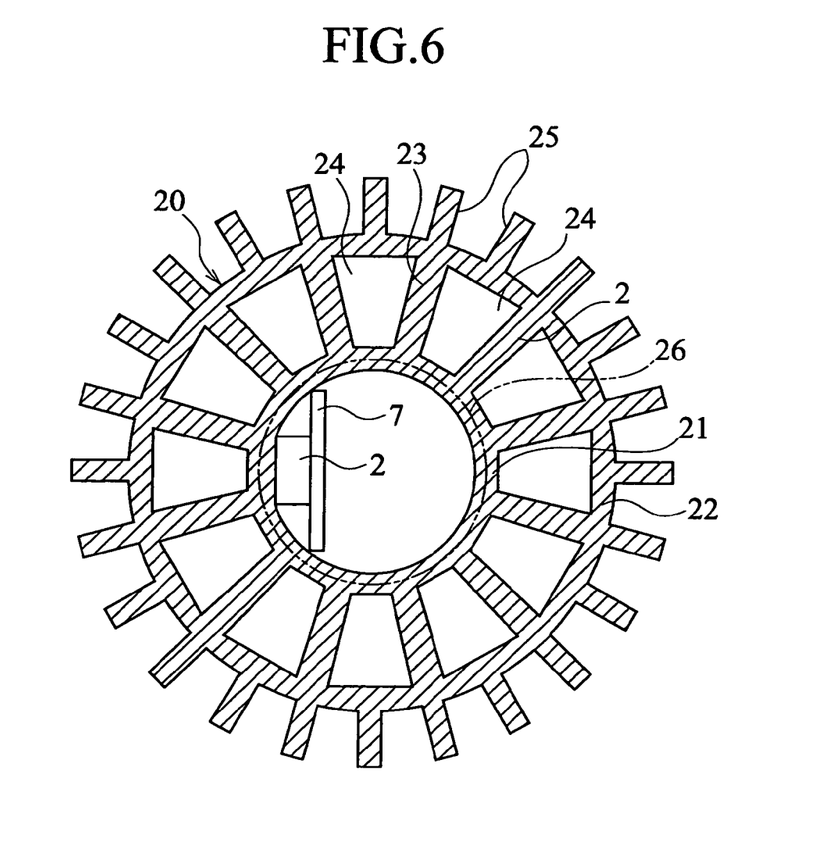
FIG. 6 is a cross-sectional view of a second modified example.

FIG. 6 is a cross-section illustrating a second modified example of the above embodiment, where the same symbols are given to the same structural portions as with the above embodiment, and description thereof will be omitted.

With this modified example, without additionally providing a case or spreader, an inner wall 21 of a heat dissipating member 20 is formed roughly in a tube-shape, and an outer wall 22 is formed roughly in a tube-shape having a radius larger than the inner wall 21, where a heat source 2 is housed within the enclosed space sectioned off by the inner wall 21, both the inner wall 21 and outer wall 22 are concentrically arranged, and the inner wall 21 and the outer wall 22 are connected via a plurality of radial partition walls 23. The partition walls 23 are arranged so that a plurality of through-holes 24 with approximately the same shape are lined up in a circle at regular intervals due to the inner wall 21, outer wall 22, and partition walls 23. The heat source 2 is fixed making surface contact with the inner side of the inner wall 21, and is formed by a metal that allows full use of the heat diffusing function of the inner wall 21. A plurality of cooling fins 25 radiate in all directions from the outer side of the outer wall 22. A cover 26 closes the top and bottom of the enclosed space sectioned off by the inner wall 21.

According to such structure, there are the following effects in addition to the same effects as with the above embodiment.

In other words, since a case nor spreader are provided, reduction in the number of parts is possible. Furthermore, since the through-holes 24 that function as chimney passageways can be arranged in the entire peripheral region of the heat source 2, which is a large region, the heat dissipating effect due to natural convection is further improved. Furthermore, due to the cooling fins 25, the heat release from the outer wall 22 increases, further improving the heat dissipating effect overall.

It should be noted that the present invention is not limited to the above embodiment or modified examples thereof that have been described as mere examples. In other words, even in cases other than the above embodiment, various modifications in design and the like are naturally allowed without departing from the technical spirit and scope of the present invention.

For example, exposing the outer side of the outer wall of the heat dissipating member to the outside of the case in the above embodiment, and providing to that the outer side of the outer wall the cooling fins provided in the second modified example is possible.

As in the above description, since a sufficient heat dissipating effect due to natural convection may be achieved according to the present invention, heat dissipation for electronic devices is possible without using forced cooling with a fan or the like. Accordingly, rise in costs and generation of noise caused by providing a fan or the like can also be controlled. Furthermore, long term reliability is secured since the heat dissipating effect is not reduced due to failure of a fan or the like. Furthermore, since there is no need to provide a fan or the like, increasing space efficiency within the case as well as achieving weight reduction is possible, thereby contributing to reduction in size and weight of electronic devices. Furthermore, with great mechanical strength, the heat dissipating member is able to function as an enforcing member and improve reliability in view of strength, as well as control rise in costs caused from additionally providing the enforcing member is possible.

While preferred embodiments of the present invention have been described using specific terms, such description is for illustrative purposes, and it is to be understood that changes and variations may be made without departing from the spirit or scope of the following claims.

The content of Application No. TOKUGAN 2002-296897 which was filed in Japan on Oct. 10, 2002 and on which the claim to priority for this application is based, is hereby incorporated by reference.

What is claimed is:

1. A heat dissipating structure for an electronic device, comprising:
    a heat source;
    a heat dissipating member having an inner wall, outer wall, and partition walls, wherein
        the inner wall directly or indirectly receives heat from the heat source,
        the outer wall opposes the inner wall at a distance,
        the partition walls connect the inner wall and the outer wall,
        the inner wall, outer wall and partition walls define a plurality of through-holes,
        the through-holes are arranged along at least one of the inner wall and the outer wall,
            each of the through-holes extending in a vertical direction within a tilt range in which gravitational influence is utilizable, and top and bottom ends of each of the through-holes open to the outside; and
    a case, which houses the heat source and the heat dissipating member,
    wherein an outer side of the outer wall of the heat dissipating member is in surface contact with an inner side of the case.

2. The heat dissipating structure according to claim 1, wherein
    the inner wall of the heat dissipating member defines an enclosed space, and
    the heat source is placed within the enclosed space.

3. The heat dissipating structure according to claim 1, wherein an outer side of the heat dissipating member has a cooling fin.

4. The heat dissipating structure according to claim 1, wherein
    the plurality of through-holes have approximately the same shape, and are lined up along at least one of the inner wall and the outer wall at regular intervals.

5. The heat dissipating structure according to claim 1, wherein a tilt of each of the through-holes is within 60° to a plumb line.

6. The heat dissipating structure according to claim 1, wherein
    a cross-sectional shape of each of the through-holes that is orthogonal to the vertical direction is approximately the same at arbitrary vertical positions.

7. The heat dissipating structure according to claim 1, wherein
    an optimum distance between opposing inner sides of two adjacent partition walls is set in accordance with a linear function of vertical length of the through-holes, and
    a distance between the opposing inner sides is set based upon the optimum distance.

8. The heat dissipating structure according to claim 1, wherein
    assuming the optimum distance between the opposing inner sides is $w_{opt}$, the vertical length of the through-hole is L, and the distance between the opposing inner sides is w, $w_{opt}$ is set according to the following equation $$w_{opt} = 0.01L + 0.005$$

and w is set within the range of $$0.95 w_{opt} \leq w \leq 1.2 w_{opt}.$$

9. The heat dissipating structure according to claim 1, further comprising:
    a heat diffusing member, which is positioned between the heat source and the inner wall of the heat dissipating member, and is in contact with the heat source and an outer side of the inner wall.

10. The heat dissipating structure according to claim 1, wherein
    a cross-section that is vertically orthogonal to the through-hole is approximately a square shape, and
    lengths of four sides of the cross-section of the through-hole are set almost equal.

11. The heat dissipating structure according to claim 1, wherein the through-holes are approximately lined up linearly.

12. The heat dissipating structure according to claim 1, wherein the through-holes are lined up in a circle.

* * * * *